United States Patent
Hu et al.

(10) Patent No.: US 10,499,529 B1
(45) Date of Patent: Dec. 3, 2019

(54) DEVICE FOR FIXING HARD DISK

(71) Applicant: Shenzhen Fugui Precision Ind. Co., Ltd., Shenzhen (CN)

(72) Inventors: Xiu-Quan Hu, Shenzhen (CN); Li-Wen Guo, Shenzhen (CN)

(73) Assignee: Shenzhen Fugui Precision Ind. Co., Ltd., Shenzhen (CN)

( * ) Notice: Subject to any disclaimer, the term of this patent is extended or adjusted under 35 U.S.C. 154(b) by 0 days.

(21) Appl. No.: 16/352,087

(22) Filed: Mar. 13, 2019

(30) Foreign Application Priority Data

Oct. 24, 2018 (CN) .......................... 2018 1 1246843

(51) Int. Cl.
*H05K 7/14* (2006.01)
*H05K 5/02* (2006.01)

(52) U.S. Cl.
CPC ......... *H05K 7/1489* (2013.01); *H05K 5/0286* (2013.01); *H05K 7/1401* (2013.01); *H05K 7/1487* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,498,722 B1* | 12/2002 | Stolz | ....................... | G06F 1/184 248/634 |
| 6,657,868 B1* | 12/2003 | Hsue | ..................... | G11B 33/128 174/138 G |
| 7,630,197 B2* | 12/2009 | Chen | ..................... | G11B 33/124 312/223.1 |
| 8,070,125 B2* | 12/2011 | Sun | ....................... | G11B 33/124 248/225.11 |
| 8,248,778 B2* | 8/2012 | Dai | ....................... | G11B 33/124 248/220.21 |
| 8,279,593 B2* | 10/2012 | Zheng | ................... | G06F 1/1601 211/26 |
| 8,289,693 B2* | 10/2012 | Li | ........................... | G06F 1/187 312/223.1 |
| 8,320,115 B2* | 11/2012 | Sun | ....................... | G06F 1/187 312/333 |
| 8,416,562 B2* | 4/2013 | Ding | ................... | G11B 33/124 248/27.3 |
| 8,830,671 B2* | 9/2014 | Chen | ..................... | G06F 1/187 361/679.33 |
| 9,030,814 B2* | 5/2015 | Tsai | ....................... | G11B 33/00 312/223.1 |
| 9,030,819 B2* | 5/2015 | He | ....................... | G11B 33/124 248/222.51 |
| 2002/0051338 A1* | 5/2002 | Jiang | ......................... | G06F 1/20 361/679.36 |

(Continued)

*Primary Examiner* — Lisa Lea-Edmonds
(74) *Attorney, Agent, or Firm* — ScienBiziP, P.C.

(57) ABSTRACT

A device with shock-absorbing qualities for fixing a hard disk in place on a chassis includes two brackets, a plurality of shock-absorbing cushions, and a plurality of first fasteners is described. The brackets located at opposite sides of a hard disk and the side surface of the bracket define a plurality of circular through holes with notches or cutaways continuing to the outer edge of the side surface. The cushions can be locked in the circular through holes after being introduced through the notches whilst sleeving the first fasteners. Two support portions are bent from ends of each bracket to support the hard disk in place.

20 Claims, 2 Drawing Sheets

(56) References Cited

U.S. PATENT DOCUMENTS

| | | | |
|---|---|---|---|
| 2003/0011974 A1* | 1/2003 | Curlee | G06F 1/184 361/679.34 |
| 2007/0263351 A1* | 11/2007 | Ho | G06F 1/1613 361/679.33 |
| 2007/0297129 A1* | 12/2007 | Liu | G06F 1/187 361/679.33 |
| 2008/0259554 A1* | 10/2008 | Qin | G06F 1/187 361/679.34 |
| 2008/0316698 A1* | 12/2008 | Yeh | G11B 33/08 361/679.33 |
| 2009/0059507 A1* | 3/2009 | Peng | G11B 33/124 361/679.33 |
| 2010/0091444 A1* | 4/2010 | Reid | G06F 1/1616 361/679.37 |
| 2012/0008273 A1* | 1/2012 | Sun | G11B 33/124 361/679.33 |
| 2013/0033813 A1* | 2/2013 | Ling | G06F 1/187 361/679.34 |
| 2013/0070414 A1* | 3/2013 | Zhang | G11B 33/124 361/679.33 |
| 2015/0116924 A1* | 4/2015 | Hung | G11B 33/124 361/679.33 |

\* cited by examiner

DEVICE FOR FIXING HARD DISK

FIELD

The subject matter herein generally relates to devices for fixing hard disk.

BACKGROUND

Hard disks are a common storage medium. In many cases, hard disks are fixed to brackets. A bracket is generally U-shaped and defines a number of circular through holes at sides of the bracket to connect the hard disk to a chassis of a computer. A cushion is generally positioned at the circular through hole. A diameter of the cushion is larger than a diameter of the circular through hole, which makes disassembly and assembly inconvenient.

Therefore, there is room for improvement within the art.

BRIEF DESCRIPTION OF THE DRAWINGS

Implementations of the present technology will now be described, by way of embodiments with reference to the attached figures.

DETAILED DESCRIPTION

Figure 1:
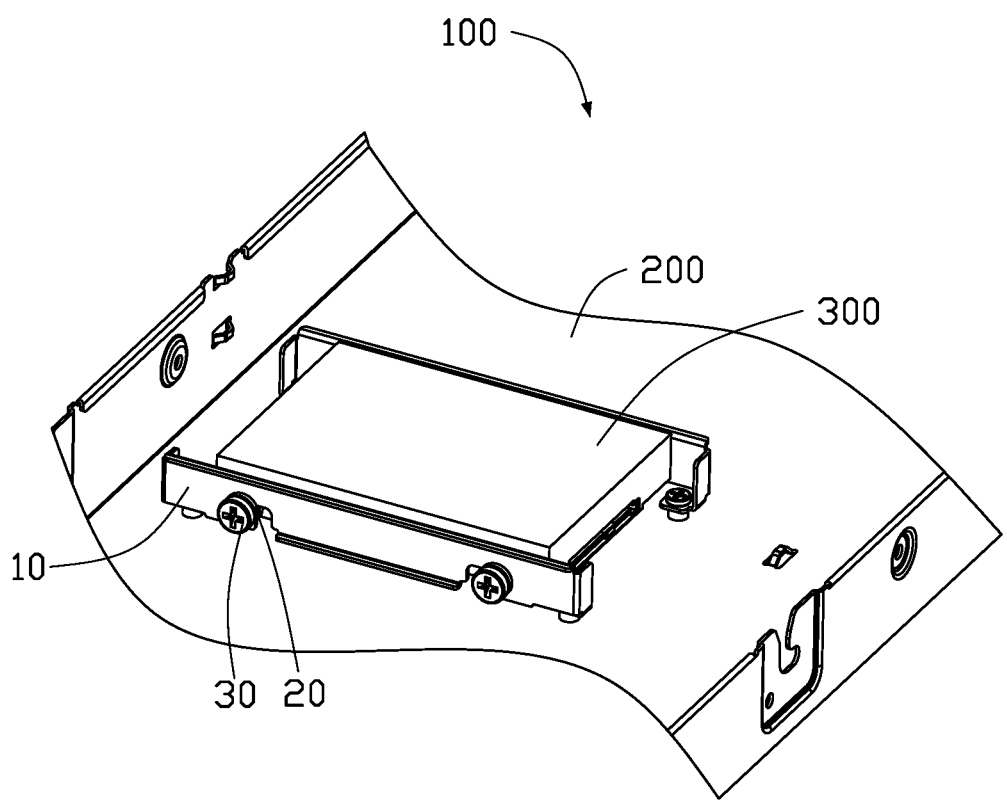
FIG. 1 is an isometric view of a device for fixing hard disk according to an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to show details and features of the present disclosure better. The disclosure is by way of embodiments and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
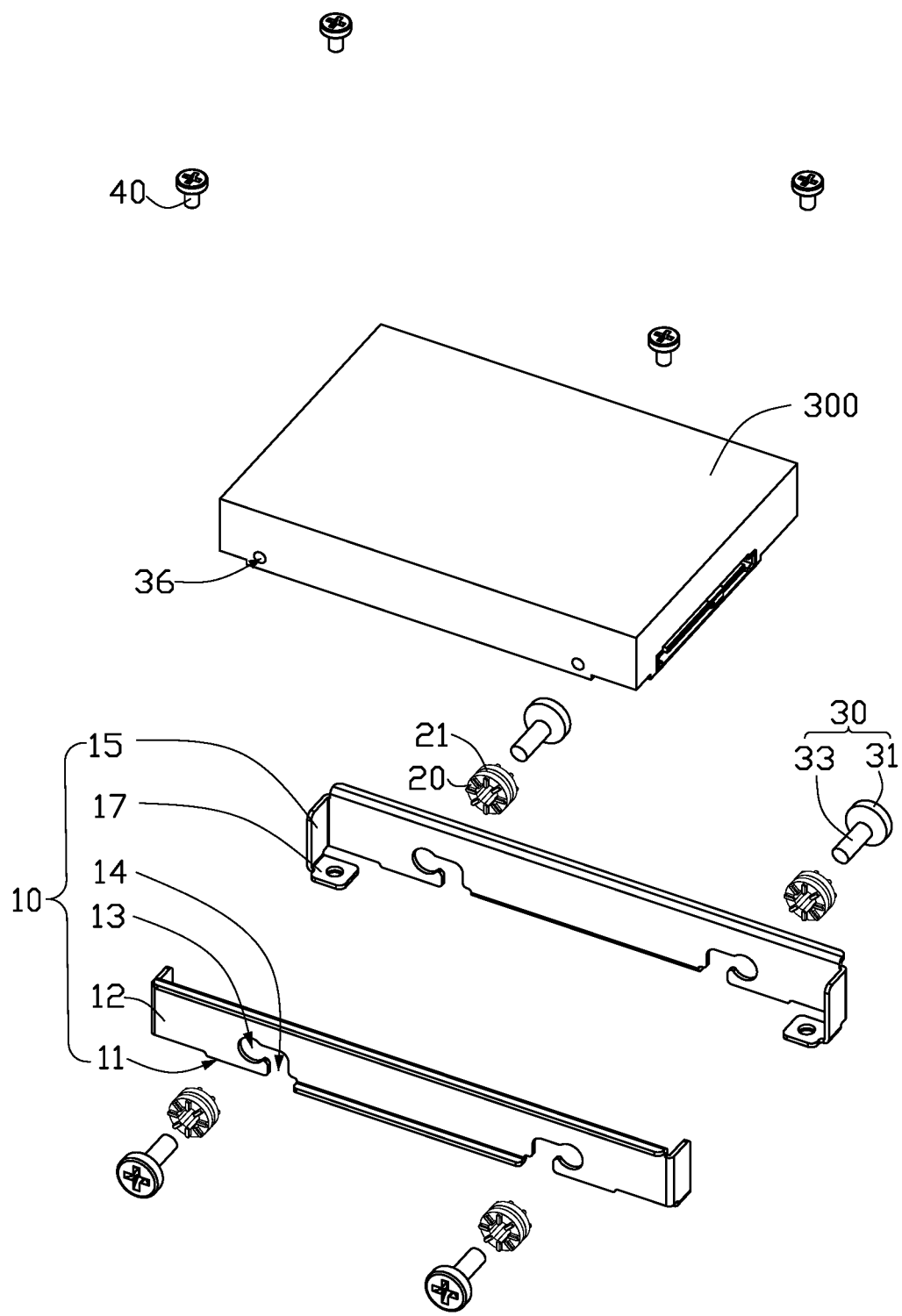
FIG. 2 is an exploded isometric view of the device of FIG. 1.

FIG. 1 and FIG. 2 illustrate a device 100 according to a first embodiment of the present application. The device 100 fixes a hard disk 300 to a chassis body 200. The device 100 includes a plurality of brackets 10, a plurality of cushions 20, and a plurality of first fasteners 30.

In the embodiment, the device 100 includes four cushions 20 and four first fasteners 30. The two brackets 10 are fixed to the chassis body 200 at intervals and are positioned on opposite sides of the hard disk 300. Each of the brackets 10 includes a plurality of circular through holes 13 and a plurality of notches 14. Two ends of each of the notches 14 extend to one of the circular through holes 13 and an edge of the bracket 10. In the embodiment, each of the brackets 10 defines two circular through holes 13 and two notches 14. The notch 14 is located on a side of the circular through hole 13 along an extension direction of the bracket 10. In another embodiment, the notch 14 is located below the circular through hole 13, the notch 14 still extends to the circular through hole 13.

An annular locking slot 21 is provided on a circumferential surface of each of the cushions 20. The annular locking slot 21 is configured to lock the bracket 10. The notch 14 extends from an edge of the bracket 10 to the circular through hole 13, allowing a sidewall of the annular locking slot 21 to pass through the notch 14 and into the circular through hole 13 to lock the bracket 10 in the annular locking slot 21. In an embodiment, the bracket 10 is locked in the annular locking slot 21 in a transitional fit or a tight fit. The cushion 20 is elastically deformed so that the sidewall of the annular locking slot 21 is clamped to the bracket 10.

A first end of the first fastener 30 abuts against a side of the cushion 20, and another end of the first fastener 30 passes through the cushion 20 and the circular through hole 13 to connect to the hard disk 300. In the embodiment, the first fastener 30 includes a shaft body 33 and a protrusion 31 protruding from an end of the shaft body 33. A surface of the protrusion 31 adjacent to the shaft body 33 abuts the cushion 20. An end of the shaft body 33 away from the protrusion 33 has an external thread. The hard disk 300 is provided with a plurality of threaded holes 36. The end of the shaft body 33 away from the protrusion 33 is screwed in the threaded hole 36 of the hard disk 300.

The bracket 10 has an elongated strip shape. The bracket 10 includes a bottom surface 11 and a side surface 12 perpendicular to the bottom surface 11. The circular through hole 13 and the notch 14 penetrate the bracket 10 from the side surface 12. The notch 14 further penetrates the bottom surface 11, so that the cushion 20 can move from the notch 14 to the circular through hole 13 and be locked in circular through hole 13. Two support portions 15 are vertically bent from two opposite ends of the bracket 10. The two support portions 15 intersect two short sides of the side faces 12. In a direction parallel to the short side of the side surface 12, two support portions 15 extend below the bottom surface 11 and then vertically bend toward each other to form two abutting portions 17.

The device 100 further includes a number of second fasteners 40. Each of the second fasteners 40 passes through one of the abutting portions 17 and is coupled to the chassis body 200 to fix the bracket 10 to the chassis body 200. A top surface of the bracket 10 opposite to the bottom surface 11 is not in contact with the chassis body 200. Thus, the bracket 10 can be used to mount the hard disk 300 at different heights. In the embodiment, the two abutting portions 17 of the bracket 10 are located between the two supporting portions 15. In another embodiment, the two support portions 15 of the bracket 10 are located between the two abutting portions 17.

The two support portions 15 are provided on sides of the bracket 10 facing the hard disk 300. A distance between the two support portions 15 of the bracket 10 is greater than a length of the hard disk 300 to allow installation space for the second fastener 40. In another embodiment, the two support portions 15 of the bracket 10 are provided on sides of the bracket 10 away from the hard disk 300. The distance between the two support portions 15 of the bracket 10 can be bigger or shorter or equal to the length of the hard disk 300.

In an embodiment, the hard disk fixture 100 further includes a plurality of buffering members (now shown). The buffering members are provided between the abutting portion 17 and the chassis body 200. The second fastener 40 sequentially passes through the abutting portion 17 and the buffering member to connect to the chassis body 200. The cushion 20 and the buffering member are made of a shockproof or shock-absorbing material, for example, rubber.

When installing the hard disk 300 to the chassis body 200, the annular locking slot 21 is aligned with the notch 14, and the cushion 20 passes through the notch 14 into the circular through hole 13. The sidewall of the annular locking slot 21 is clamped to the bracket 10. The circular through hole 13 is aligned with the threaded hole 36 of the hard disk 300. The shaft body 33 passes through the cushion 20 and the circular through hole 13 and connects to the hard disk 300. Opposite surfaces of the cushion 20 abut against the protrusion 31 and the hard disk 300. The brackets 10 are positioned at opposite sides of the hard disk 300 and connected to the opposite sides of the hard disk 300. The bracket 10 is positioned on the chassis body 200 and the abutting portion 17 touches the chassis body 200. The second fastener 40 passes though the abutting portion 17 to be coupled to the chassis body 200 and the bracket 10 fix the hard disk 300 to the chassis body 200.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A device configured to fix a hard disk to a chassis body, the device comprising:
   a plurality of brackets configured to positioned two opposite sides of the hard disk, each of the brackets comprising a bottom surface and a side surface adjacent to the bottom surface, the side surface defining a plurality of circular through holes;
   a plurality of cushions locked in the plurality of the circular through holes;
   a plurality of first fasteners passing through the cushions to connect the brackets to the hard disk;
   two support portions bending from two ends of each of the brackets; and
   two abutting portions extending from the two support portions of each of the brackets and positioned below the bottom surface to be fixed to the chassis body.

2. The device of claim 1, wherein the side surface further defines a plurality of notches, the plurality of notches extend to the plurality of circular through holes and an edge of the bracket.

3. The device of claim 1, wherein an annular locking slot is defined on an circumferential surface of each of the cushions, the cushion is deformable, the bracket is locked in the annular locking slot.

4. The device of claim 3, wherein the bracket is locked in the annular locking slot in a transitional fit.

5. The device of claim 1, wherein each of the first fasteners comprises a shaft body and a protrusion protruding from an end of the shaft body, a surface of each of the protrusions adjacent to the shaft body abuts the cushion, an end of each of the shaft bodies away from the protrusion has an external thread and is screwed in one of threaded holes defined on the hard disk.

6. The device of claim 1, wherein the two support portions on each of the brackets are located on a side of the bracket facing the hard disk.

7. The device of claim 6, wherein the two abutting portions extending from the two abutting portions on each of the brackets are located between the two support portions of each of the brackets.

8. The device of claim 6, wherein the two support portions of each of the brackets are located between the two abutting portions extending from the two support portions.

9. The device of claim 1, wherein the device further comprises a plurality of second fasteners, each of the second fasteners passes though one of the abutting portions and is coupled to the chassis body.

10. The device of claim 1, wherein the cushion is made of rubber.

11. A device configured to fix a hard disk to a chassis body, the device comprising:
    a plurality of brackets parallel to each other and configured to positioned two sides of the hard disk, each of the brackets comprising a bottom surface and a side surface perpendicular to the bottom surface, the side surface defining a plurality of circular through holes;
    a plurality of cushions locked in the plurality of the circular through holes;
    a plurality of first fasteners, one end of each of the first fastener passing through one of the cushions to be fixed to the hard disk;
    two support portions bending from two opposite ends of each of the brackets; and
    two abutting portions extending from the two support portions of each of the brackets and positioned below the bottom surface to be fixed to the chassis body.

12. The device of claim 11, wherein the side surface further defines a plurality of notches, the plurality of notches extend to the plurality of circular through holes and an edge of the bracket.

13. The device of claim 11, wherein an annular locking slot is defined on an circumferential surface of each of the cushions, the cushion is deformable, the bracket is locked in the annular locking slot.

14. The device of claim 13, wherein the bracket is locked in the annular locking slot in a transitional fit.

15. The device of claim 11, wherein each of the first fasteners comprises a shaft body and a protrusion protruding from an end of the shaft body, a surface of each of the protrusions adjacent to the shaft body abuts the cushion, an end of each of the shaft bodies away from the protrusion has an external thread and is screwed in one of threaded holes defined on the hard disk.

16. The device of claim 11, wherein the two support portions on each of the brackets are located on a side of the bracket facing the hard disk.

17. The device of claim 16, wherein the two abutting portions extending from the two abutting portions on each of the brackets are located between the two support portions of each of the brackets.

18. The device of claim 16, wherein the two support portions of each of the brackets are located between the two abutting portions extending from the two support portions.

19. The device of claim 11, wherein the device further comprises a plurality of second fasteners, each of the second fasteners passes though one of the abutting portions and is coupled to the chassis body.

20. The device of claim 11, wherein the cushion is made of rubber.

\* \* \* \* \*